(12) United States Patent
Samavati

(10) Patent No.: US 7,171,184 B2
(45) Date of Patent: Jan. 30, 2007

(54) METHOD AND APPARATUS FOR A GAIN CONTROLLED MIXER

(75) Inventor: Hirad Samavati, Santa Clara, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 407 days.

(21) Appl. No.: 10/837,534

(22) Filed: Apr. 29, 2004

(65) Prior Publication Data

US 2005/0258888 A1    Nov. 24, 2005

(51) Int. Cl.
*H04B 1/18* (2006.01)

(52) U.S. Cl. .................. 455/293; 455/189.1; 455/42

(58) Field of Classification Search ............ 455/232.1, 455/234.1, 85–86, 141, 147, 189.1, 293, 455/323, 205, 110, 102, 42, 17, 23; 375/261, 375/271, 298
See application file for complete search history.

(56) References Cited

U.S. PATENT DOCUMENTS

| 5,293,406 A | * | 3/1994 | Suzuki | 375/295 |
| 6,983,135 B1 | * | 1/2006 | Tsai et al. | 455/234.1 |
| 2002/0080890 A1 | | 6/2002 | Kaczynski | |

* cited by examiner

*Primary Examiner*—Edward F. Urban
*Assistant Examiner*—Tu X. Nguyen
(74) *Attorney, Agent, or Firm*—Van Pelt, Yi & James LLP

(57) ABSTRACT

A gain controlled mixer for an integrated CMOS transceiver. Accuracy of the controlled gain may be relatively invariant over temperature, manufacturing process, and other variations attendant to circuit realizations in a CMOS transceiver, and other realizations. A plurality of substantially matched circuit elements are instantiated and disposed similarly within the gain controlled mixer, enhancing the gain accuracy of selectable gain control states. Matching gain and other functions between circuit elements is further enhanced by appropriately controlling DC operating point conditions.

42 Claims, 9 Drawing Sheets

METHOD AND APPARATUS FOR A GAIN CONTROLLED MIXER

FIELD OF THE INVENTION

The present invention is generally related to a transceiver. More particularly, the present invention relates to a method and apparatus for achieving mixing and gain control.

BACKGROUND OF THE INVENTION

A transceiver is a device, containing a transmitter and a receiver, which is thus capable of transmitting and receiving communication signals, respectively. Conventionally, the transmitter contains a power amplifier (PA) that provides the last stage of amplification of the signal to be transmitted.

In some conventional designs, the power amplifier is implemented as a component that is physically separate from other parts of the transmitter and/or transceiver. Also, power amplifiers made from gallium arsenide (GaAs) or silicon bipolar junction transistors (SiBJT) are typically used because they have an inherently higher breakdown voltage than transistors made in a CMOS circuit, whether the transistors are n-channel or p-channel transistors. While such designs allow for a power amplifier that has the desired amplification characteristics, they do so at the expense of cost. Not only is a GaAs, SiBJT or other non-CMOS power amplifier transistor costlier than a transistor in a CMOS integrated circuit, but the non-CMOS power amplifier cannot be formed on the same integrated circuit chip as the components of the transmitter and/or transceiver. Both of these factors add to the overall cost of the resulting transceiver.

It has been recognized that it would be beneficial to have a transceiver in which most of the transmitter and receiver circuits are on a single chip, including the power amplifier. For example, in the article entitled A Single Chip CMOS Direct-Conversion Transceiver for 900 MHz Spread Spectrum Digital Cordless Phones by T. Cho et al. that was presented at the 1999 IEEE International Solid State Circuits Conference, there is described a CMOS transceiver chip that includes an integrated power amplifier. An improved CMOS power amplifier is also described in the application entitled CMOS TRANSCEIVER HAVING AN INTEGRATED POWER AMPLIFIER, bearing application Ser. No. 09/663,101, filed on Sep. 15, 2000 and assigned to the same assignee as the assignee of the invention described herein, which recognizes the advantage of integrating the power amplifier.

Nevertheless, some CMOS power amplifiers exhibit power level variation due to their sensitivity to thermal and process variations. These sensitivities may limit the accuracy of conventional means of providing variable gain in a CMOS power amplifier. High efficiency and constant power levels in CMOS power amplifiers may be impeded by low breakdown voltage, low current drive, and lossy substrate.

Accordingly, an improved gain control technique for transceivers would be useful.

BRIEF DESCRIPTION OF THE DRAWINGS

Various embodiments of the invention are disclosed in the following detailed description and the accompanying drawings.

The above, and other objects, features, and advantages of the present invention are further described in the detailed description which follows, with reference to the drawings by way of non-limiting exemplary embodiments of the present invention, wherein like reference numerals represent similar parts of the present invention throughout several views and wherein.

DETAILED DESCRIPTION

Figure 1:
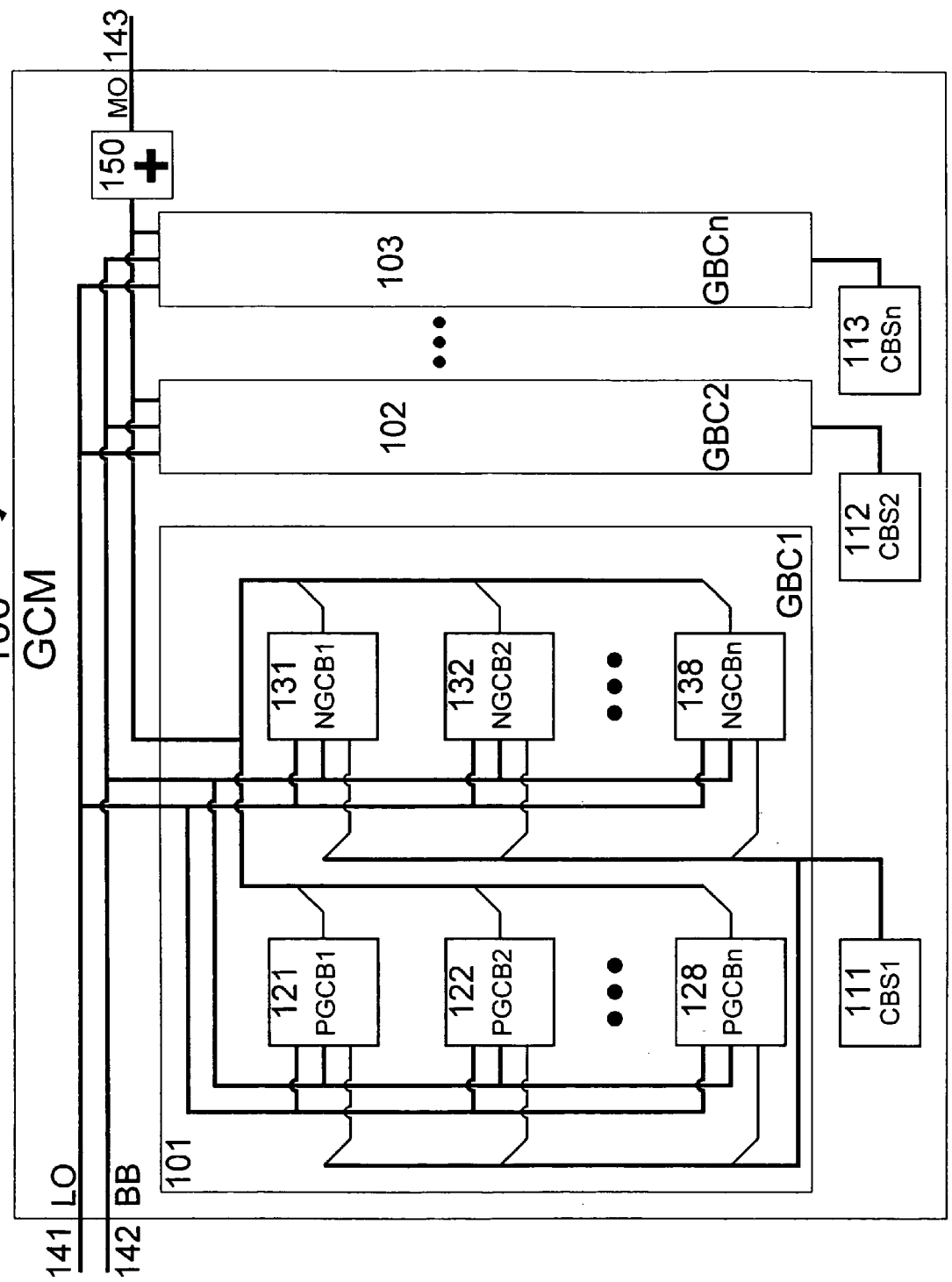
FIG. 1 illustrates a block diagram of an embodiment of a gain controlled mixer (GCM) according to the present invention.

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Reference will now be made in detail to one or more preferred embodiments of the invention, examples of which are illustrated in the accompanying drawings. Wherever convenient, the same reference numbers will be used throughout the drawings to refer to the same or like parts. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in details so that the present invention is not unnecessarily obscured.

Other embodiments will be apparent to those skilled in the art from consideration of the specification and practice of the invention disclosed herein. It is intended that the specification and examples be considered as exemplary only, with a true scope of the invention being indicated by the following claims and equivalents. Accordingly, it is intended that the scope of the invention be defined by the following Claims and their equivalents.

The information-bearing signals described herein are time-varying. Representations of such a signal, such as by a voltage or a current, may additionally comprise a substantially constant component that does not convey information. These constituents of a signal may be described as AC and DC signal components, respectively. Reference may also be made to DC operating points, or operating conditions, of a circuit, system, or method, to describe conditions that remain substantially constant over time. Many time-varying signals may be instantiated as differential signals, having both a positive and negative component.

The following table provides explanation for selected exemplary block and signal names used herein. Where convenient, similar names with varying suffixes may be used to refer to blocks or signals with the same or like functionality.

| BLOCK | |
|---|---|
| GCM | gain controlled mixer |
| GBC | gain block cell |
| CBS | conversion block selector |
| GCB | gain conversion block |
| GCBP | gain conversion block pair |
| PGCB | positive gain conversion block |
| NGCB | negative gain conversion block |
| QPGCB | portion of a PGCB that processes quadrature (Q) input signal components |
| QNGCB | portion of a NGCB that processes quadrature (Q) input signal components |
| IPGCB | portion of a PGCB that processes in-phase (I) input signal components |
| INGCB | portion of a NGCB that processes in-phase (I) input signal components |
| SIGNAL | |
| LO | local oscillator |
| LOni, LOpi | local oscillator, differential pair (negative, positive), I component |
| LOnq, LOpq | local oscillator, differential pair (negative, positive), Q component |
| ini, ipi | input, differential pair (negative, positive), I component |
| inq, ipq | input, differential pair (negative, positive), Q component |
| On, Op | output, differential pair (negative, positive) |
| CWI | control word input |

FIG. 1 is a block diagram of a gain controlled mixer GCM 100. By way of example and not limitation, GCM 100 receives input signals local oscillator (LO) 141, and baseband (BB) 142, and GCM 100 provides output signal mixer output (MO) 143. Each of the gain block cells GBC1 111 through GBCn 113 provide both a mixing function between the input signals and a controllable gain upon the mixed result. Outputs of the gain block cells are received and combined by a summing node 150. The summing node 150 provides an output signal of the GCM 100, mixer output (MO) 143.

Within each gain block cell, there are one or more positive gain conversion blocks (PGCB) and one or more negative gain conversion blocks (NGCB). Each PGCB and NGCB provides combined mixing and gain functions. Each of the PGCB and NGCB within a gain block cell may be selectively enabled. An enabled PGCB provides gain of opposite polarity to the gain provided by an enabled NGCB.

In FIG. 1, GBC1 111 comprises positive gain block cells PGCB1 121 through PGCBn 128, and negative gain block cells NGCB1 131 through NGCBn 138. Each of the positive and negative gain block cells in GBC1 is selectively enabled. Conversion block selector CBS1 111 provides individual GCB enable signals to each of the positive gain conversion blocks and negative gain conversion blocks within GBC1. Similarly, CBS2 112 provides GCB enable signals to positive gain block cells and negative gain block cells within GBC2, and CBSn 113 similarly provides for GBCn 103. Each CBS provides a mapping that enables particular combinations of PGCB and NGCB in response to a control word input. Advantageously, a selectable "power-down" state may be provided, in which all of the PGCB and NGCB in each GBC, hence the entire GCM, are contemporaneously disabled, thus reducing circuit power consumption.

In this embodiment, conversion block selectors CBS1 111 through CBSn 113 are connected one to each corresponding GBC. In other embodiments, conversion block selectors may number greater or lesser than the number of gain block cells, and, individual conversion block selectors may be connected to one or more gain block cells.

Embodiments of GCM 100 may comprise one or more gain block cells, as indicated by ellipses located on the figure between GBC2 102 and GBCn 103.

In providing an output, the summing node 150 may give equal weighting to its inputs, that is, the GBC outputs it receives. In some embodiments, summing node 150 is simply an interconnection amongst GBCs 101–103, receiving signal current contributions from each GBC.

Embodiments of individual gain block cells may comprise one or more positive gain conversion blocks and one or more negative gain conversion blocks, as indicated by ellipses located on the figure between PGCB2 122 and PGCBn 128, and, between NGCB2 128 and NGCBn 138, respectively.

Notably, the use of the index "n" following any of PGCB, NGCB, GBC or CBS illustrates that among each designator, a variable number of elements may be instantiated and not that the number of instantiations of each element is necessarily the same.

Figure 2:
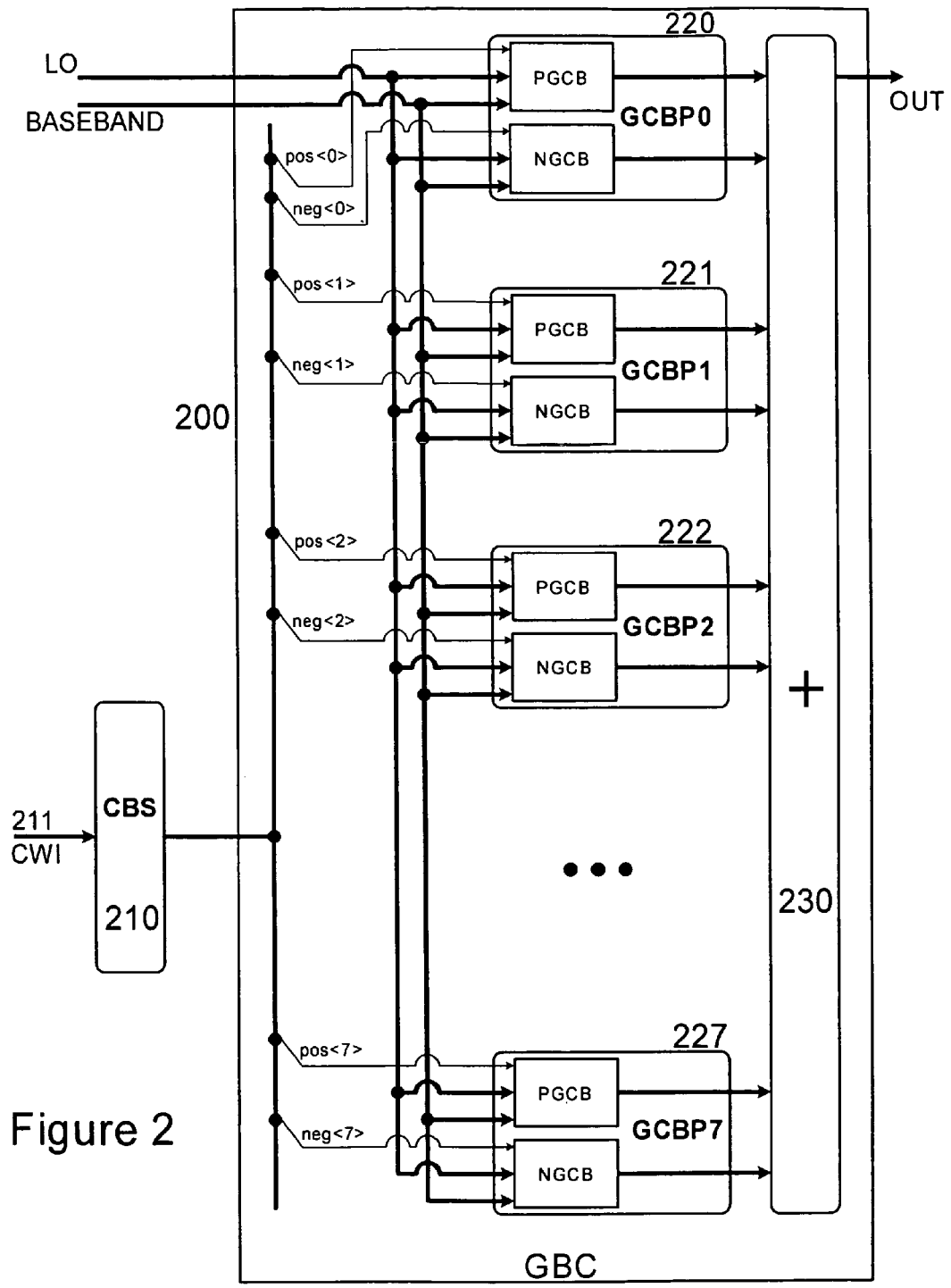
FIG. 2 illustrates a block diagram of an embodiment of a gain block cell (GBC) according to the present invention.

In FIG. 2, a block diagram of a gain block cell GBC 200 comprising a plurality of gain conversion block pairs (GCBPs) coupled to a conversion block selector CBS 210 is shown. Each gain conversion block pair GCBP 220–227 is formed by the combination of a PGCB and a NGCB. It should be appreciated that this structure accommodates an illustrative embodiment shown here comprising eight GCBPs, GCBP0 220 through GCBP7 227. By way of example and not limitation, each GCBP receives common LO and baseband differential input signals. Outputs of each of the GCBPs 220–227 are summed together, in a common summing node 230. Common summing node 230 may simply be an interconnection amongst GCBPs 220–227, receiving signal current contributions from each. Each GCBP 220–227 receives distinct control signals that separately enable the positive gain conversion block and the negative gain conversion block within each GCBP 220–227. That is, the "nth" GCBP receives GBC enable signals pos<n> and neg<n> respectively, for n=(0,1,2, . . . ,7). These signals are provided by conversion block selector CBS 210, in response to a control word input CWI 211. GBC 220 mixes a local oscillator LO signal input with a baseband signal input and provides selectable gain for the resultant output signal provided by common summing node 230.

Figure 3A:
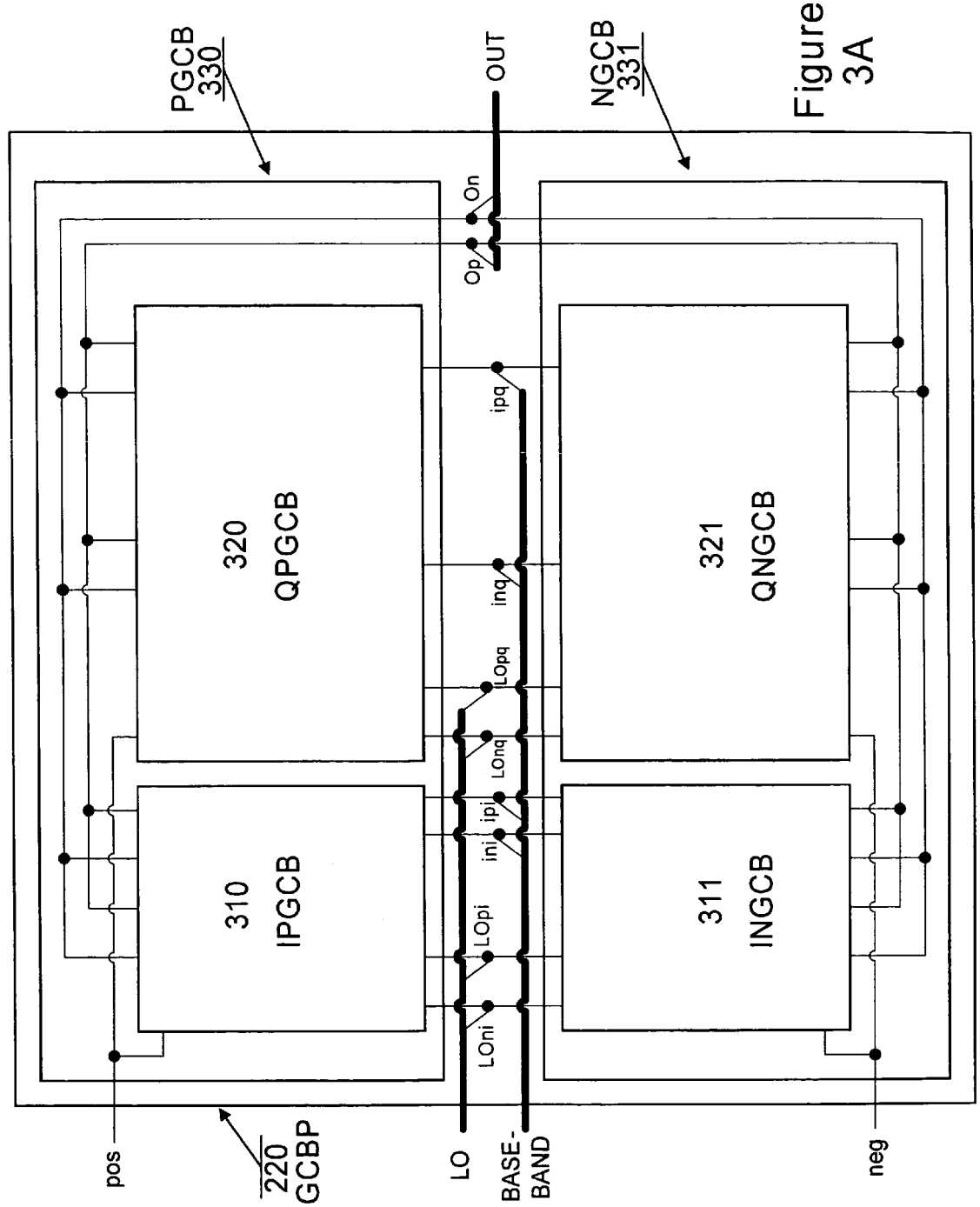
FIG. 3A illustrates a schematic diagram of an embodiment of a gain conversion block pair (GCBP) according to the present invention.
Figure 3B:
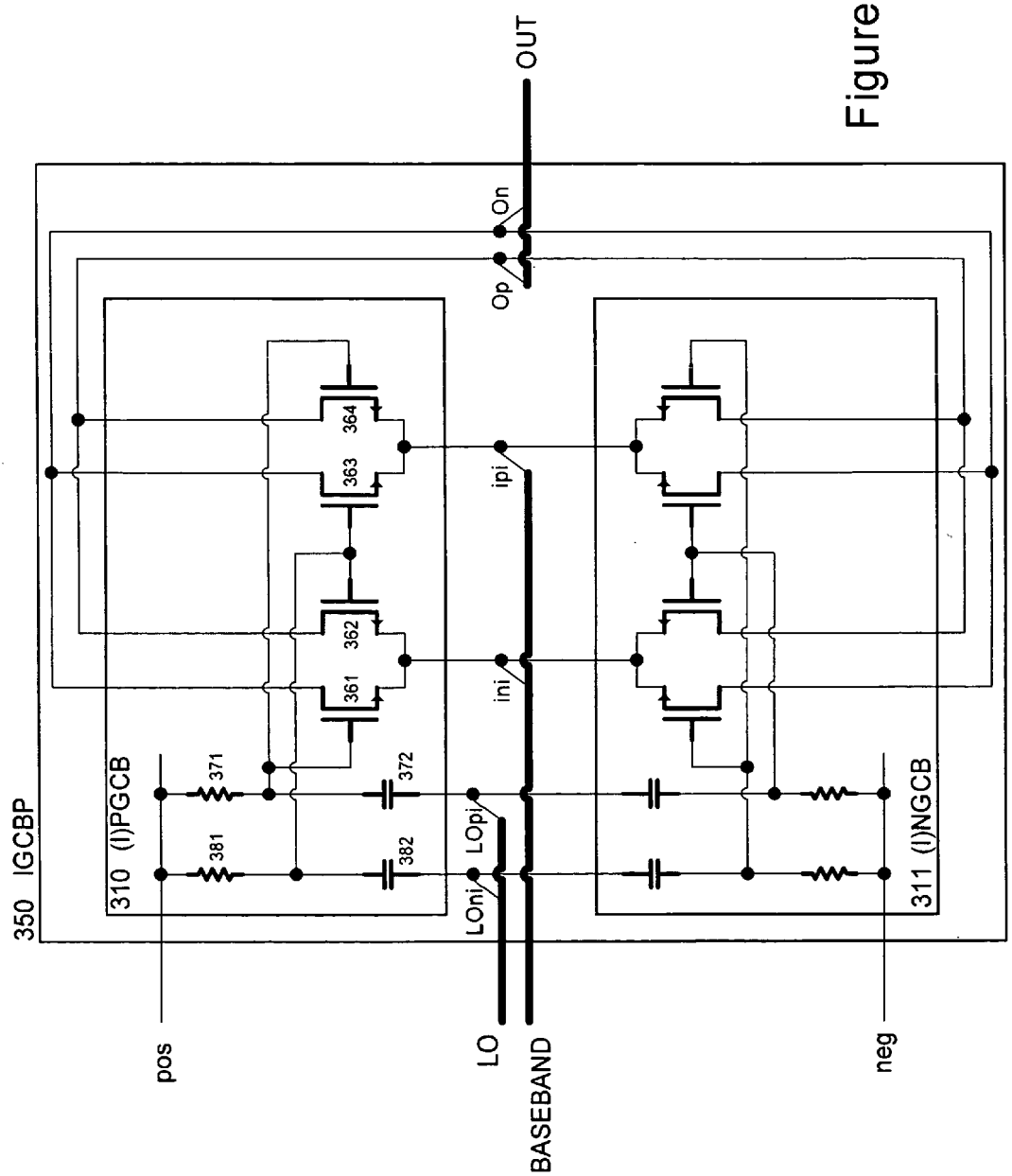
FIG. 3B illustrates a schematic diagram of an embodiment of a gain conversion block pair GCBP according to the present invention.
Figure 3C:
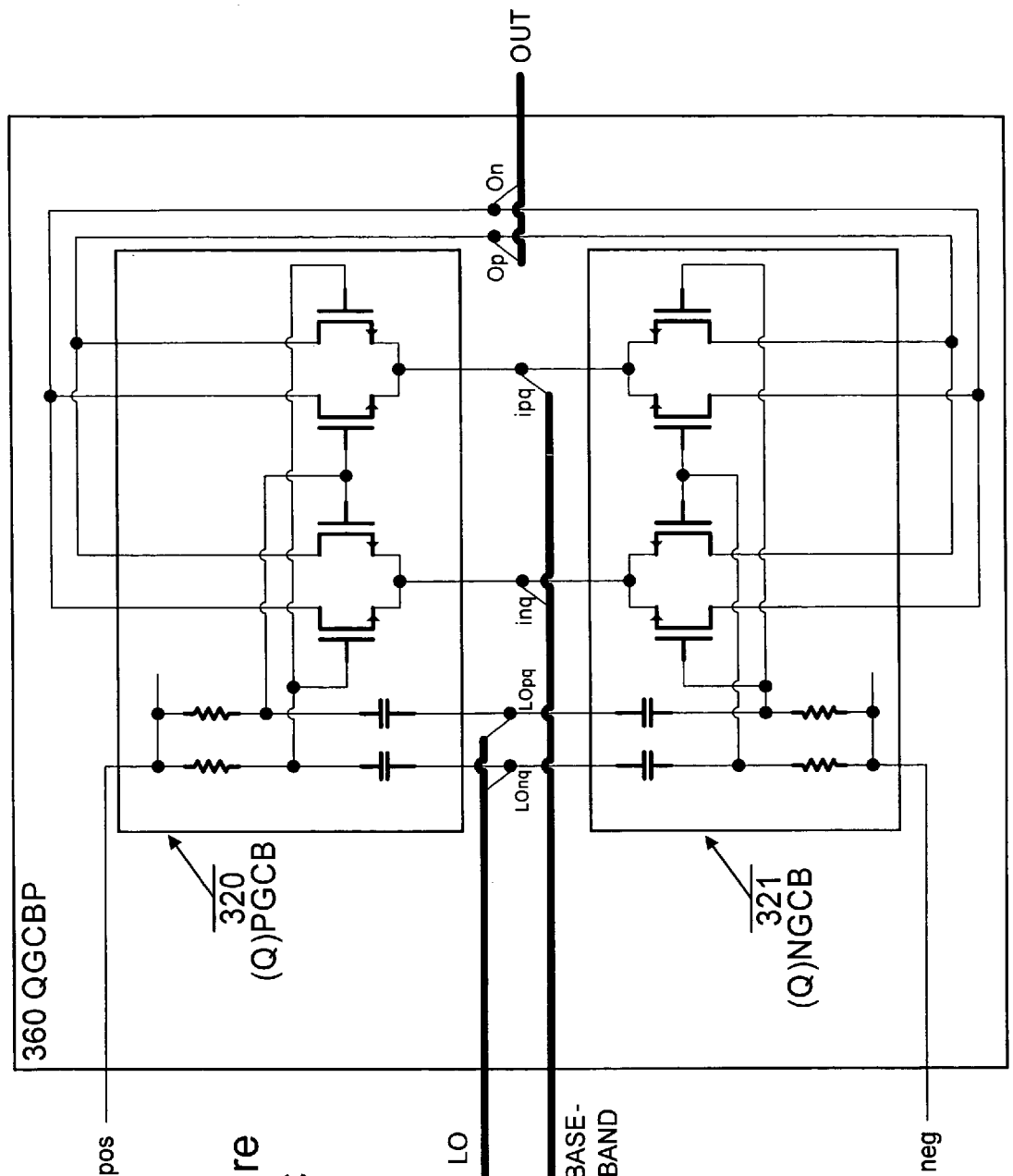
FIG. 3C illustrates a schematic diagram of an embodiment of a gain conversion block pair GCBP according to the present invention.

In one embodiment, each of the LO and baseband input signals comprise input signal differential pairs separately for I and Q components, and the GBC output is a differential current pair, as shown and described further in FIGS. 3A, 3B, and 3C.

The CBS 210 provides a decoding function for the control word input CWI 211. In one embodiment the decoding may be trivially implemented as a register, wherein the CBS 210 outputs are bit-wise equivalents of the control word input CWI 211. In other embodiments, the CBS 210 may be implemented with a look-up table function. A power-down state for the GBC 200 may be achieved in one or more of the selectable output states of the CBS 210, wherein every one of the positive and negative gain conversion blocks within each GCBP 220–227 are disabled. This power-down state advantageously reduces power consumed by the CMOS transceiver. A power-down state for the GBC 200 shown in FIG. 2 is achieved by means of the CBS 210 outputs contemporaneously disabling all of the GCB enable signals to the PGCB and the NGCB within every gain conversion block pair GCBP 220–227.

In one embodiment of the GBC 200, the selectable positive and negative gains available from each GCBP are substantially equal in magnitude, that is, the absolute value of the gains are substantially matched. To further explain by example, within each GCBP 220–227 as further shown and described in FIG. 3A, the circuit elements of PGCB 330 can, in one embodiment, each be substantially matched by the circuit elements of NGCB 331. The LO and baseband input signals are in common to PGCB 330 and NGCB 331. The gain conversion blocks 310, 311, 320, and 321 comprise similarly disposed electrical circuit elements that process distinct input signals. As a consequence, for a given set of LO and baseband signal inputs to the GCBP 220, the magnitude of the output signal produced under the condition of positive gain enabled (pos<n>=Vdd, neg<n>=0) is substantially equal to the magnitude of the output signal produced under the condition of negative gain enabled (pos<n>=0, neg<n>=Vdd).

Referring again to FIG. 2, in one embodiment of the GBC 200, within each of the GCBPs GCBP0 220 through GCBP 227, the PGCB and NGCB are well-matched to each other. Furthermore each of the PGCB and NGCB within each GCBP are well-matched to each other as a consequence of substantially matched circuit elements and topology, and common input signals. Thus, for this embodiment, maximum positive gain for this GBC 200 will result from contemporaneously enabling each PGCB within each of the GCBPs 220–227, and that this resulting maximum positive gain is approximately equal to eight times the positive gain resulting from the enablement of a single PGCB. Similarly, the maximum negative gain for GBC 200 will result from enabling each NGCB within each of the GCBPs 220–227 shown and this resulting maximum negative gain is approximately equal to eight times the negative gain resulting from the enablement of a single NGCB. The magnitude of the maximum positive gain is substantially equal to the magnitude of the maximum negative gain in this embodiment.

To more readily illustrate the process of gain selection, the term "x" is herein defined as the unit of gain provided in this embodiment by a single positive gain conversion block.

It is possible to generate, by means of the CBS decoding function 210, control states for GBC 220 gains that range from 8x to −8x, in controllable steps of 1x, in addition to a power down state that is both equivalent to 0x and disables each PGCB and NGCB.

Negative gains may be useful, for example, in the transmit chain of a transceiver for driving a phased antenna array or in the receive chain for selecting signal polarities for baseband signal processing.

Improved gain control accuracy may advantageously be obtained by using gain cancellation to produce gain values intermediate to the maximum positive and negative gains for GCB 200. Referring again to GCBP0 220 through GCBP7 227 as shown and described in FIG. 2, it is notable that the DC operating points for current source inputs and outputs are substantially the same under the condition of positive gain enablement (pos<n>=Vdd, neg<n>=0) and negative gain enablement (pos<n>=0, neg<n>=Vdd). By maintaining a single enabled positive or negative conversion block in each GCBP 220–227, the aggregate of circuit DC operating points are held substantially constant across changes in overall GBC 200 gain.

By maintaining a single enabled positive or negative conversion block in each GCBP 220–227, effective gain cancellation occurs when one or more positive gain conversion blocks are enabled within selected ones of GCBPs 220–227, while one or more negative gain conversion blocks are enabled in other selected ones of GCBPs 220–227. To a substantial extent, GCBPs enabled for opposite gain polarities "cancel each other out" with respect to AC gain, resulting in a net gain contribution for the GBC 220 that is equivalent to the difference between the number of positive and negative gain conversion blocks that are enabled.

For example, a net gain of 4x may be obtained by enabling 6 PGCB (in 6 of GCBPs 220–227) while enabling 2 NGCB (in the 2 remaining of GCBPs 220–227). This has the desirable feature of maintaining consistent DC operating points within the overall GBC 220 circuit, which further contributes to the substantial gain matching over various gain settings and between portions of the circuitry.

When using this gain cancellation technique to set specific GBC gain levels, the range of (+8x to −8x) still obtains, but the step size is now 2x.

In FIG. 3A, a positive gain conversion block PGCB 320 and negative gain conversion block NGCB 321 are shown, together forming a gain conversion block pair GCBP 220. PGCB 320 comprises a portion responsible for processing I component inputs, IPGCB 310, and, a portion responsible for processing Q component inputs, QPGCB 320. Similarly, NGCB 331 comprises INGCB 311 and QNGCB 321.

In some embodiments a GCBP 220 may provide processing for one of I input or Q input processing, but not both. By way of example and not limitation, gain conversion block pairs are shown in FIGS. 3B and 3C that provide solely I input and solely Q input processing, respectively. In FIG. 3B, IGCBP 350 comprises PGCB 310 and NGCB 311. As FIG. 3B shows, PGCB 310 comprises only a portion for processing I inputs. This portion of this PGCB, which may be called an IPGCB, is thus identical to an entire PGCB 350 in GCBP 220. Hence we have labeled the circuit 310 (I)PGCB in the figure to emphasize that it may be either an IPGCB or a PGCB in this case. The NGCB is correspondingly labeled (I)NGCB 311, as it may be either an INGCB or a NGCB.

The QGCBP 360 of FIG. 3C comprises PGCB 320 and NGCB 321. These gain conversion blocks comprise only portions for processing Q inputs, in this embodiment. Hence they are labeled (Q)PGCB and (Q)NGCB, because PGCB 320 may be either a PGCB or a QPGCB, and, NGCB 321 may be either a NGCB or a QNGCB, according to the notation used herein.

The electrical circuit elements making up each of the positive and negative gain conversion blocks in FIG. 3A are substantially the same. It can also be appreciated that the circuit elements used for processing the in-phase (I) differential current signals for baseband input and local oscillator (LO) input, as shown in FIG. 3B (I)PGCB 310 and (I)NGCB 311, are substantially the same as the elements used for processing the quadrature (Q) differential current signals for baseband input and local oscillator input, as shown in FIG. 3C (Q)PGCB 320 and (Q)PGCB 321. Notably, 310, 311, 320, and 321 comprise similarly disposed electrical circuit elements that process distinct input signals.

GCBP 220 mixes the local oscillator (LO) signal input with the baseband signal input and provides selectable gain for the resultant output signal. The GCB enable signals pos and neg selectively enable corresponding positive and negative gain conversion blocks, resulting in a positive or negative gain contribution, respectively, in the signal path. Essentially zero gain is contributed when neither pos nor neg are enabled. In some embodiments, essentially zero gain may also be contributed upon enabling both pos and neg, as taught further herinafter.

The baseband input signal input may comprise both in-phase (I) and quadrature (Q) differential current inputs, shown here as ipi, ini, and ipq, inq, respectively. The local oscillator (LO) input may comprise both in-phase (I) and quadrature (Q) differential voltage inputs, shown here as LOpi, LOni and LOpq, LOnq, respectively. The output signal comprises a single instance of differential current outputs, shown here as Op, On. The output signal is a result of summing output currents from the circuits each of IPGCB 310, INGCB 311, QPGCB 320, and QNGCB 321.

In order to illustrate in further detail the mixing circuit function, first consider the portion of this circuitry providing positive gain to the mix of in-phase (I) differential components of the input and LO signals. These elements are shown in (I)PGCB 310 in FIG. 3B.

When each of the NMOS transistors 361, 362, 363, and 364 are enabled, each of their drain current AC-component signal outputs represents a mix, or product, of their AC-component gate voltage signal and their AC-component source current signal inputs. The transistors are enabled by a DC voltage bias when the pos signal is at a high logic level, that is, when pos is at a voltage substantially equal to Vdd.

When pos is at a low logic level, that is, when pos is at a voltage substantially equal to 0V or logic ground, these transistors are disabled, whereupon their drain current AC output signal is essentially zero and does not contribute significantly to the AC output current of the overall circuit.

The AC voltage signal at the gate of transistors 361 and 364 represents the AC voltage signal input provided by the positive member of the differential input pair of the local oscillator, LOpi. The AC input voltage is coupled to the gate AC voltage by the C 372. Similarly, the AC voltage signal at the gate of transistors 362 and 363 represents the AC voltage signal input provided by the negative member of the differential input pair of the local oscillator, LOni, which has been coupled to the gate AC voltage by C 382.

The AC source current signal at the drain of transistors 363 and 364 is provided by the positive member of the differential input pair of the baseband input, ipi. The AC source current signal at the drain of transistors 361 and 362 is similarly provided by the negative member of the differential input pair of the baseband input, ini.

The LO in-phase I component differential voltage inputs result in differential voltage inputs to the gates of transistors 363 and 364. To the extent that the LO input differential input members' AC components are complementary, that is, substantially equal and opposite, the gate-source voltages on 363 and 364 are also equal and opposite. Current flowing from the common source connection is effectively steered at any moment to the drain of one of 363 and 364, resulting in a consistent operating point for the current source ipi.

The output signal from each of the enabled transistors 361, 362, 363, and 364 results from mixing two AC signal inputs. The drain current AC signal output of 364 corresponds to mixing the AC signal present on the positive member of the LO differential input, LOpi, with the AC signal present on the positive member of the baseband input, ipi. The drain current of 364 is summed into the positive member of the differential output of this circuit, Op. Output contributions resulting from mixing like signs of input members contribute to the positive member of the differential circuit output, and output contributions resulting from mixing different signs contribute to the negative member of the differential circuit output. Thus 362 output, resulting from a mix of two negative members, LOni and ini, contributes to Op. The outputs of 361 and 363, both resulting from mixing a combination of positive and negative members ( (LOpi,ini) and (LOni, ipi) respectively), are summed into On.

As described above, a positive gain from the mix of in-phase (I) components of the input signals may be obtained by means of (I)PGCB 310 in FIG. 3B. The positive gain is selectively enabled by means of a pos GCB enable signal.

(I)NGCB 311 provides negative gain from the mix of in-phase (I) components of the input signals, is shown as 311 in FIG. 3B. The negative gain is selectively enabled by means of a neg GCB enable signal.

As is further illustrated in FIG. 3B, the circuit elements and topology (I)NGCB 311 are notably similar to (I)PGCB 310, described above. (I)NGCB 311 may be briefly described as an instantiation of (I)PGCB 310 with the following differences:

Gain is selectively enabled by means of the neg signal.

The drain current outputs of the transistors are summed to the positive and negative members of the differential output with the opposite sense to that described for the (I)PGCB, 310. That is, (I)NGCB 311, different-sign contributions are directed to Op, and like-sign contributions are directed to On. Output contributions resulting from mixing like signs of input members contribute to the negative member of the differential circuit output, and output contributions resulting from mixing different signs contribute to the negative member of the differential circuit output.

A PGCB 330 is shown in FIG. 3A, with processing for both in-phase (I) and quadrature (Q) input signal components provided by IPGCB 310 and QPGCB 320. It provides positive gain for the mix of in-phase (I) components of the input signals, and negative gain for the mix of quadrature (Q) components of the input signals. The gain is selectively enabled by means of a pos GCB enable signal.

Note that, for QPGCB 320, the drain current outputs of the transistors are summed to the positive and negative members of the differential output with the opposite sense to that described for the IPGCB 310. For QPGCB 320, different-sign contributions are directed to Op, and like-sign contributions are directed to On. Output contributions resulting from mixing like signs of input signals contribute to the negative member of the differential circuit output, and output contributions resulting from mixing different signs contribute to the positive member of the differential circuit output.

In FIG. 3A, NGCB 331 includes circuitry for processing both in-phase (I) and quadrature (Q) input signal components, corresponding to INGCB 311 and QNGCB 321. It provides negative gain for the mix of in-phase (I) components of the input signals, and positive gain for the mix of quadrature (Q) components of the input signals. The gain is selectively enabled by means of the neg GCB enable signal.

Note that, for the Q portion QNGCB 321 of this NGCB 331, the drain current outputs of the transistors are summed to the positive and negative members of the differential output with the opposite sense to that described for the I portion, INGCB 311.

That is, for the NGCB circuit in 321, like-sign contributions are directed to Op, and different-sign contributions are directed to On. Output contributions resulting from mixing like signs of input members contribute to the positive member of the differential circuit output, and output contributions resulting from mixing different signs contribute to the negative member of the differential circuit output.

In the description of PGCB 330 and NGCB 331 that include both I and Q component processing, positive gain conversion blocks supply positive gain for the mix of I components, but negative gain for the mix of Q components, and negative gain conversion blocks supply negative gain for the mix of I components, but positive gain for the mix of Q components. This treatment of Q component polarities is intentional, and advantageous for some signal processing functions that may be accomplished within a transceiver, such as sideband suppression in modulation and demodulation schemes. For the present invention, the descriptions herein will describe the combination of I and Q gain results selectively enabled in a PGCB as "positive gain" and the gain results selectively enabled in a NGCB as "negative gain", notwithstanding the details of the relative polarity of I and Q portions and components within each PGCB and NGCB.

It is notable that circuits IPGCB 310, QPGCB 311, INGCB 320, and QNGCB 321 comprise similarly disposed electrical circuit elements that process distinct input signals. In some embodiments, the properties of elements within these circuits may be very substantially matched. For example, within and between these circuits, the transistors, resistors, capacitors, and connections between elements may be instantiated in a CMOS circuit with substantially similar geometry and other physical characteristics. Notably, the degree to which circuit element properties match within a CMOS implementation is highly dependent upon geometry, and significantly independent of manufacturing process and temperature variation. Consequently, a CMOS embodiment that includes multiple instantiations of IPGCB 310, QPGCB 311, INGCB 320, and QNGCB 321 may have substantially similar mixing and gain performance between like circuits as a consequence of instantiations having substantially similarly matched circuit elements. For example, a CMOS embodiment may advantageously provide a substantially similar output signal, in terms of resultant gain and mix, from a first instantiation of IPGCB 310 and a second instantiation of IPGCB 310, under the conditions that both instantiations are provided substantially similar inputs.

Figure 7:
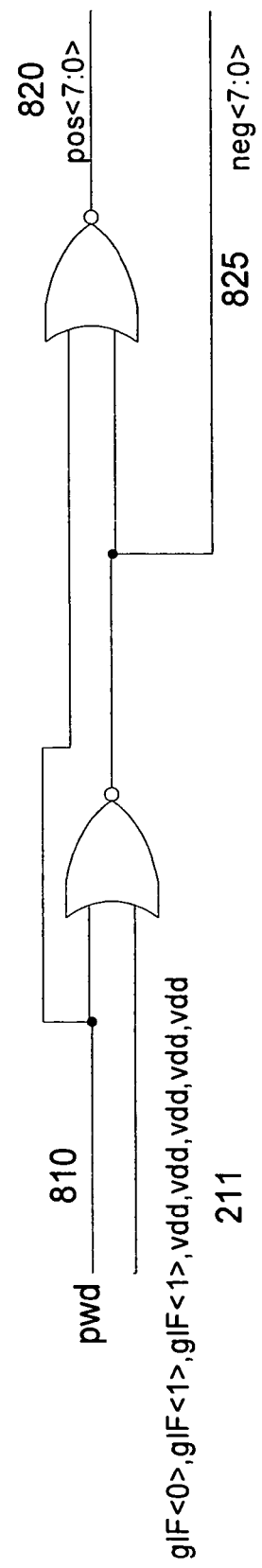
FIG. 7 illustrates a schematic diagram of a conversion block selector (CBS).

FIG. 7 illustrates a logic decoder embodiment of a CBS 210, in a condensed schematic form. The circuit includes eight instantiations of the logic gates shown. Signal names that are indexed in this representation straightforwardly correspond to the eight indexed instantiations. A control word input 211 comprising gIF<0>, gIF<1>, and pwd is decoded by logic gates, producing control signals pos<7:0> 820 and neg<7:0> 825. The resulting control signals are appropriate as GBC enable signals for GCBPs 220–227, as illustrated in FIG. 2. Typically, pos<0> and neg<0> serve as GBC enable signals for a first PGCB and a first NGCB within a first GCBP, respectively. pos<1> and neg<1> serve as GBC enable signals for a second PGCB and a second NGCB within a second GCBP, respectively, and so on. Note that when the pwd 810 input signal is enabled, it results in a "power down" state, regardless of the logical state of the other inputs. Also note that this CBS implements gain cancellation. As shown in the table following, this CBS in combination with a GBC 200 as illustrated and described in FIG. 2 provides for selectable gains of 2x, 4x, 6x, and 8x, and, a power-down state with essentially zero gain. In the table, logic states are shown for input signals, along with corresponding counts of enabled PGCBs and NGCBs, and a resulting gain contribution for the GBC that is controlled by the CBS.

| pwd | gIF<0> | gIF<1> | PGCB enabled (count) | NGCB enabled (count) | GBC gain |
|---|---|---|---|---|---|
| 0 | 0 | 0 | 5 | 3 | 2x |
| 0 | 0 | 1 | 6 | 2 | 4x |
| 0 | 1 | 0 | 7 | 1 | 6x |
| 0 | 1 | 1 | 8 | 0 | 8x |
| 1 | (don't care) | (don't care) | 0 | 0 | power-down |

Figure 4:
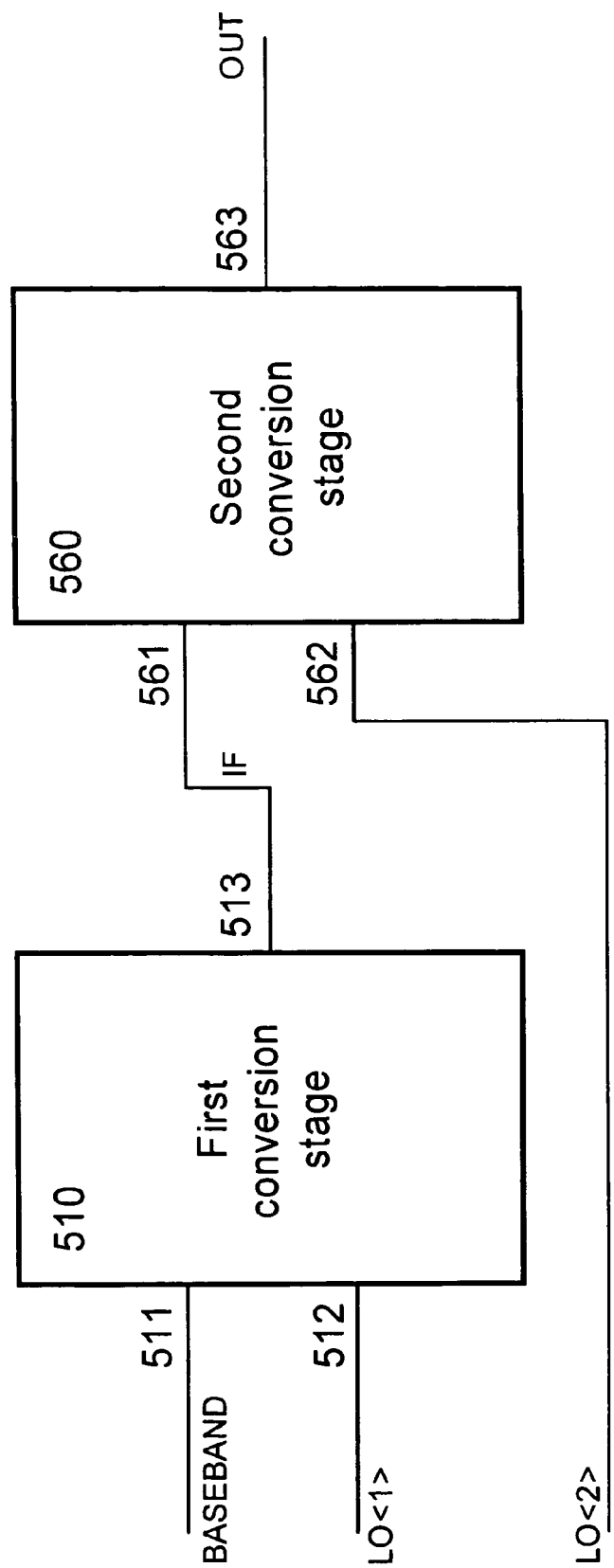
FIG. 4 illustrates a block diagram of a gain controlled mixer including first and second conversion stages according to an embodiment of the present invention.

FIG. 4 is a block diagram of a dual-conversion gain controlled mixer (GCM) comprising a first conversion stage 510 and a second conversion stage 560. The first conversion stage provides mixing of baseband 511 and first local oscillator (LO<1>) 512 input signals. In some embodiments the first conversion stage also provides controllable gain by means of gain conversion blocks within, the gain conversion blocks being enabled by one or more related conversion block selectors.

The second conversion stage 560 receives as input signals the output of the first conversion stage IF 561, and, a second local oscillator LO<2> 562. The second conversion stage provides mixing of these input signals. In some embodiments the second conversion stage also provides controllable gain by means of gain conversion blocks within, that are enabled by one or more conversion block selectors.

In some embodiments, the input and output signals may each comprise both in-phase (I) and quadrature (Q) signal components.

Figure 5:
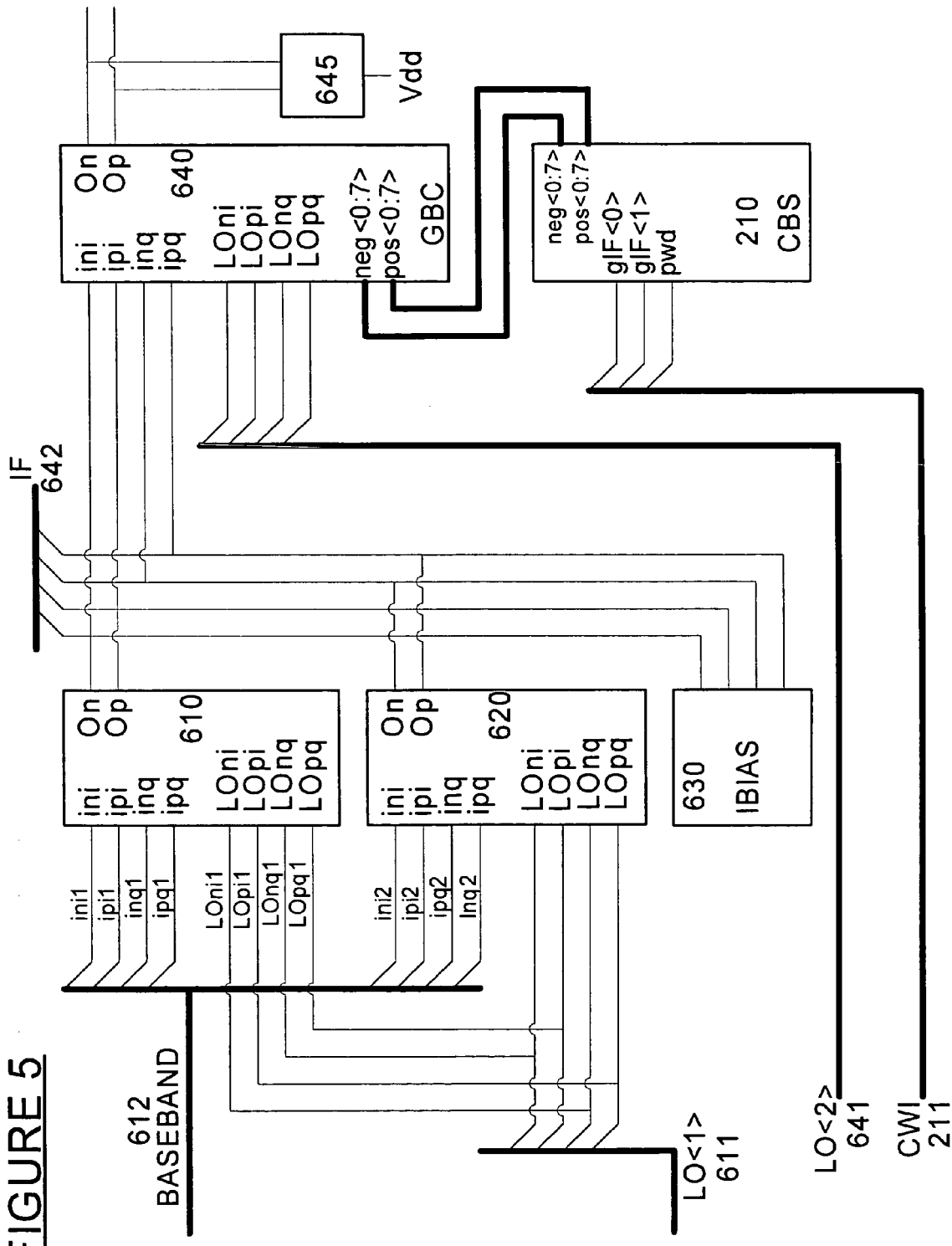
FIG. 5 illustrates a schematic diagram of a gain controlled mixer including first and second conversion stages according to the present invention.

FIG. 5 illustrates, in schematic form, one embodiment of a gain controlled mixer having both a first and a second conversion stage.

The first conversion stage, comprising Gilbert Cell mixers 610 and 620, provides mixing of the baseband 612 and first local oscillator LO<1> 611 input signals.

The second conversion stage receives as input signals the output of the first conversion stage IF 642, and, a second local oscillator LO<2> 641. The second conversion stage provides mixing and gain functions in gain block cell GBC 640. A conversion block selector CBS 210 provides a control state for GBC 640, expressed as the logic levels present on GCB enable signals neg<0:7> and pos<0:7>, that are received as GBC 640 inputs. A control state may be distinctly selected from a plurality of available states, including a plurality of gain selections and a power down state. CBS 210 provides a mapping or decoding function, mapping values of the control word input CWI 211 to specific logic levels for the pos<0:7> and neg<0:7> GBC enable signal outputs.

The signal output of this gain controlled mixer is represented as differential current outputs Op and On of GBC 640. Note that in this embodiment, a load network 645 has been provided to convert the AC current outputs to voltage representations. The load network 645 may comprise lossy inductors, in some embodiments.

Current source bias circuits within IBIAS 630 provide DC bias currents to the IF 642 circuit nodes. These provided DC bias currents reduce the DC current flowing through the IF signal inputs, labeled ini, ipi, inq, ipq in GBC 640. The reduced input DC current provides an improved operating condition for the (positive and negative) gain conversion blocks within GBC 640, allowing for relatively larger gain capability than would otherwise be the case. The reduced DC current requirements may advantageously enhance the linearity of the gain conversion blocks and reduce the drive requirement for the local oscillator inputs LO<2> 641.

The first conversion stage input signal baseband 612 comprises differential current pairs conveying in-phase (I) and quadrature (Q) signal components. The similarly-labeled individual baseband input signals received at the inputs of Gilbert Cell mixers 610 and 620 are substantially identical. For example, the ini1 and ini2 elements of baseband 612 may be provided by the outputs of distinct current drivers receiving the same signal input. Note the opposing polarity of Q component inputs provided to the Gilbert Cell mixers 610 and 620 in FIG. 5.

The first conversion stage input signal LO<1> 611 comprises differential voltage signal pairs conveying I and Q signal components, as is shown in FIG. 5. Note that Gilbert Cell mixer 620 receives input components I and Q transposed relative to Gilbert Cell mixer 610.

Outputs of the first conversion stage IF 642 comprise I and Q components as shown in FIG. 5. These signals are represented with differential current signal pairs.

The second conversion stage input signal LO<2> 641 comprises differential voltage signal pairs conveying I and Q signal components, as is shown in FIG. 5.

The output of the second conversion stage, the differential current pair On and Op of gain block cell GBC 640, comprise an I (in-phase) component.

Figure 6:
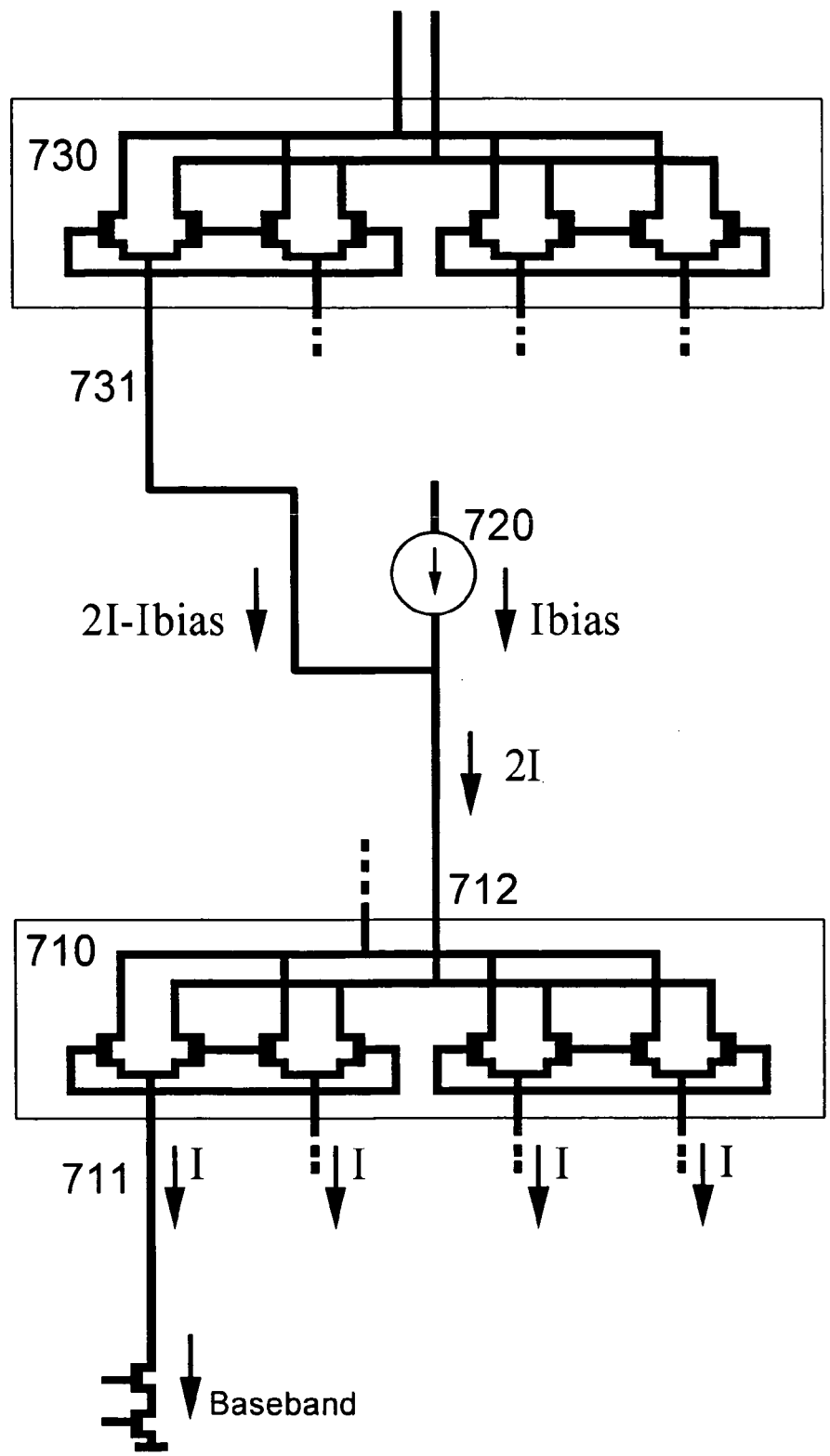
FIG. 6 illustrates a schematic diagram of current source bias circuits.

FIG. 6 illustrates, in a simplified schematic diagram, a current source bias circuit disposed between first and second conversion stages in a gain controlled mixer. Elements of the first conversion stage are shown within 710. Elements of the second conversion stage are shown within 730. These elements are common to embodiments of conversion stages that perform a mixing function, that is, mixers, including (positive and negative) gain conversion blocks, as well as Gilbert Cell mixers. In order to reduce the amount of DC current that flows into the second conversion stage mixers, current sources have been provided as shown in FIG. 6. Reducing the amount of DC current that flows into the second conversion stage mixers may advantageously enhance the linearity, and, reduce the amount of LO drive required for the second conversion stage mixers.

One element of the first conversion stage output is a DC current sink 712 of 2I units, shown in FIG. 6. A DC current source bias circuit 720 provides Ibias units of current towards the 2I unit current requirement of 712. The DC current source requirement at the second conversion stage input 731 is thereby reduced from 2I to (2I-Ibias) by the presence of the bias current source 720.

FIG. 6 illustrates that circuit elements of the first and second conversion stages may be disposed in a cascode configuration.

Accordingly, it is intended that the scope of the invention be defined by the following Claims and their equivalents.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A gain controlled mixer for use in a transceiver comprising:
    a gain block cell, each gain block cell comprising a positive gain conversion block and a negative gain conversion block and a summing node receiving outputs of the positive gain conversion block and the negative gain conversion block;
    wherein each of said positive gain conversion block and said negative gain conversion block is configured to receive a gain conversion block enable signal and the gain controlled mixer is configured to enter a selectable power-down state wherein no gain conversion blocks are enabled.

2. A gain controlled mixer for use in a transceiver comprising:
    a gain block cell, each gain block cell comprising a positive gain conversion block and a negative gain conversion block and a summing node receiving outouts of the positive gain conversion block and the negative gain conversion block;
    wherein each of said positive gain conversion block and said negative gain conversion block is configured to receive a gain conversion block enable signal and within the gain block cell all the positive gain conversion blocks and negative gain conversion blocks have substantially matched absolute gains.

3. The apparatus of claim 2 wherein within the gain block cell, more negative gain conversion blocks are enabled than positive gain conversion blocks are enabled, thereby inverting the corresponding gain block cell output polarity.

4. The apparatus of claim 2 wherein a gain block cell, the positive gain conversion bhicks and negative gain conversion blocks are instantiated in equal quantity, with each positive gain conversion block disposed with a corresponding negative gain conversion block to form a gain conversion block pair.

5. The apparatus of claim 2 wherein within each gain block cell, only one of the positive gain conversion block or one of the negative gain conversion block of each gain conversion block pair is selectively enabled by the gain conversion block enable signals.

6. The apparatus of claim 5 further comprising a conversion block selector, the conversion block selector configured to accept a control word input and configured to generate the gain conversion block enable signals.

7. The apparatus of claim 5 wherein within a gain block cell, the quantity of gain conversion block pairs is 8.

8. The apparatus according to claim 2, further comprising:
    a baseband input;
    a first LO input; and
    a mixer output.

9. The apparatus of claim 8 wherein the baseband input comprises in-phase (I) and quadrature (Q) signal components.

10. The apparatus of claim 8 wherein the first LO input comprises in-phase (I) and quadrature (Q) signal components.

11. The apparatus of claim 8 wherein the mixer output comprises in-phase (I) and quadrature (Q) signal components.

12. The apparatus according to claim 2 wherein the gain controlled mixer further comprises:
    a first and a second conversion stage;
    the first conversion stage further comprising:
    a baseband input;
    a first LO input; and,
    a first conversion stage output;
    the second conversion stage further comprising:
    a second LO input;
    an input coupled to the first conversion stage output; and
    a second conversion stage output.

13. The apparatus of claim 12 wherein the baseband input further comprises an in-phase (I) and a quadrature (Q) signal component.

14. The apparatus of claim 12 wherein the first LO input further comprises an in-phase (I) arid a quadrature (Q) signal component.

15. The apparatus of claim 12 wherein the first conversion stage output further comprises an in-phase (I) and a quadrature (Q) signal component.

16. The apparatus of claim 12 wherein the input of the second conversion stage further comprises an in-phase (I) and a quadrature (Q) signal component.

17. The apparatus of claim 12 wherein the second LO input further comprises an in-phase (I) and a quadrature (Q) signal component.

18. The apparatus of claim 12 wherein the second conversion stage output further comprises an in-phase (I) and a quadrature (Q) signal component.

19. The apparatus of claim 12 further comprising a current source bias circuit that is disposed to sum with the first conversion stage output and connected to the second conversion stage input.

20. The apparatus of claim 12 wherein the first conversion stage and the second conversion stage are disposed in a cascode configuration.

21. The apparatus of claim 12 wherein at least one of the first conversion stage or the second conversion stage comprises a gain block cell.

22. A method of controlling gain in a mixer for use in a transceiver comprising the steps of:
    inputting a plurality of signals to a gain block cell, each gain block cell having a positive gain conversion block, and having a negative gain conversion block;
    selectively enabling certain positive gain conversion blocks and negative gain conversion blocks;
    summing outputs of the positive gain conversion block and the negative gain conversion block; and
    selecting a power-down state for the gain controlled mixer wherein no gain conversion blocks are enabled.

23. A method of controlling gain in a mixer for use in a transceiver comprising the steps of:
    inputting a plurality of signals to a gain block cell, each gain block cell having a positive gain conversion block, and having a negative gain conversion block;
    selectively enabling certain positive gain conversion blocks and negative gain conversion blocks;
    summing outputs of the positive gain conversion block and the negative gain conversion block; and
    instantiating the positive gain conversion blocks and the negative gain conversion blocks having substantially matched absolute gains within the gain block cell.

24. The method of claim 23, further comprising the step of: enabling more negative gain conversion blocks than positive gain conversion blocks within a gain block cell, thereby inverting the polarity of the corresponding gain block cell.

25. The method of claim 23, further comprising the steps of:
    instantiating positive gain conversion blocks and negative gain conversion blocks in equal quantity within a gain block cell; and
    forming gain conversion block pairs within the gain block cell by pairing each positive gain conversion block with a corresponding negative gain conversion block.

26. The method of claim 25, further comprising the steps of: selectively enabling only one of the positive gain conversion block or the negative gain conversion block of each gain conversion block pair within a gain block cell.

27. The method of claim 25, further comprising the steps of: decoding a control word input to selectively enable particular combinations of positive gain conversion blocks and negative gain conversion blocks.

28. The method of claim 25, further comprising the step of: providing 8 gain conversion block pairs within a gain block cell.

29. The method according to claim 23, further comprising the steps of:
    receiving a baseband input;
    receiving a first LO input; and
    generating a mixer output.

30. The method of claim 29, further comprising the steps of: receiving in-phase (I) and quadrature (Q) signal components of the baseband input.

31. The method of claim 29, further comprising the steps of: receiving in-phase (I) and quadrature (Q) signal components of the first LO input.

32. The method of claim 29, further comprising the steps of: generating in-phase (I) and quadrature (Q) signal components of the mixer output.

33. The method according to claim 23, further comprising:
    instantiating a first and second conversion stage;
    receiving a baseband input and a first LO input to the first conversion stage;
    generating a first conversion stage output;
    inputting the first conversion stage output and a second LO input to the second conversion stage;
    generating a second conversion stage output.

34. The method of claim 33, further comprising the step of: receiving in-phase (I) and quadrature (Q) signal components of the baseband input.

35. The method of claim 33, further comprising the step of: receiving in-phase (I) and quadrature (Q) signal components of the first LO input.

36. The method of claim 33, further comprising the step of: generating in-phase (D and quadrature (Q) signal components of the first conversion stage output.

37. The method of claim 33, further comprising the step of: receiving in-phase (I) and quadrature (Q) signal components of the second conversion stage input.

38. The method of claim 33, further comprising the step of:

receiving in-phase (I) and quadrature (Q) signal components of the second LO input.

39. The method of claim 33, further comprising the step of: generating in-phase (D and quadrature (Q) signal components of the second conversion stage output.

40. The method of claim 33, further comprising the steps of:

instantiating one or more DC bias sources;

summing the DC bias sources with the first conversion stage output; and inputting the summed DC bias sources and first conversion stage output to the second conversion stage input.

41. The method of claim 33, further comprising the step of: instantiating the first conversion stage and the second conversion stage in a cascode configuration;

42. The method of claim 33, further comprising the step of: instantiating one or more gain block cells in at least one of the first conversion stage or the second conversion stage.

* * * * *

UNITED STATES PATENT AND TRADEMARK OFFICE
CERTIFICATE OF CORRECTION

PATENT NO. : 7,171,184 B2  Page 1 of 1
APPLICATION NO. : 10/837534
DATED : January 30, 2007
INVENTOR(S) : Hirad Samavati It is certified that error appears in the above-identified patent and that said Letters Patent is hereby corrected as shown below:

Claim 4
Column 12, line 47 delete "bhicks" and insert -- blocks --

Claim 36
Column 14, line 63 delete "(D" and insert -- (I) --

Claim 39
Column 15, line 6 delete "(D" and insert -- (I) --

Signed and Sealed this

Eighth Day of September, 2009

David J. Kappos
*Director of the United States Patent and Trademark Office*